(12) United States Patent
Usui et al.

(10) Patent No.: US 7,724,536 B2
(45) Date of Patent: May 25, 2010

(54) CIRCUIT DEVICE

(75) Inventors: Ryosuke Usui, Ichinomiya (JP); Hideki Mizuhara, Ichinomiya (JP); Yasunori Inoue, Ogaki (JP); Katsunori Kobayashi, Kumagaya (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/392,578

(22) Filed: Mar. 30, 2006

(65) Prior Publication Data

US 2006/0219432 A1    Oct. 5, 2006

(30) Foreign Application Priority Data

Mar. 30, 2005   (JP) ............... 2005-099600
Mar. 6, 2006    (JP) ............... 2006-058838

(51) Int. Cl.
*H05K 1/18* (2006.01)

(52) U.S. Cl. ............ 361/761; 361/309; 361/306.3; 257/678; 257/686; 257/724; 257/771; 174/255; 174/256; 174/260; 174/532

(58) Field of Classification Search ......... 361/718, 361/719, 720, 722, 736, 748, 764, 761, 309, 361/306, 306.3; 257/678, 686, 724, 771; 174/255, 256, 260, 532, 723, 678
See application file for complete search history.

(56) References Cited

U.S. PATENT DOCUMENTS

| 6,225,227 | B1 * | 5/2001 | Aizawa ................. 438/694 |
| 6,370,013 | B1 * | 4/2002 | Iino et al. ............ 361/306.3 |
| 6,512,182 | B2 * | 1/2003 | Takeuchi et al. ......... 174/256 |
| 6,873,035 | B2 * | 3/2005 | Watanabe et al. ......... 257/686 |
| 6,914,322 | B2 * | 7/2005 | Iijima et al. ............ 257/678 |
| 7,348,496 | B2 * | 3/2008 | Wermer et al. .......... 174/260 |
| 2006/0138621 | A1 * | 6/2006 | Bogner et al. ........... 257/678 |

FOREIGN PATENT DOCUMENTS

JP    7-193347 A    7/1995

* cited by examiner

*Primary Examiner*—Tuan T Dinh
*Assistant Examiner*—Xiaoliang Chen
(74) *Attorney, Agent, or Firm*—McDermott Will & Emery LLP (57) ABSTRACT

A circuit device capable of suppressing reduction of reliability resulting from heat generated in a circuit element is obtained. This circuit device comprises a first insulating layer having a first opening and a second opening, a first conductor filling up the first opening of the first insulating layer, a second conductor, formed along the inner side surface of the second opening of the first insulating layer, having a concave upper surface and a circuit element arranged above a region of the first insulating layer formed with the first opening.

2 Claims, 6 Drawing Sheets

CIRCUIT DEVICE

BACKGROUND OF THE INVENTION

1. Field of the Invention

The present invention relates to a circuit device, and more particularly, it relates to a circuit device comprising a circuit element.

2. Description of the Background Art

In a circuit device included in an electronic apparatus or the like, the heating value per unit volume has recently been increased due to downsizing, densification and multi-functioning. In recent years, therefore, a metal substrate having high heat radiability has been employed as the substrate for the circuit device, and a circuit element such as an IC (integrated circuit) or an LSI (large-scale integrated circuit) has been mounted on the metal substrate (refer to Japanese Patent Laying-Open No. 7-193347 (1995), for example).

Figure 16:
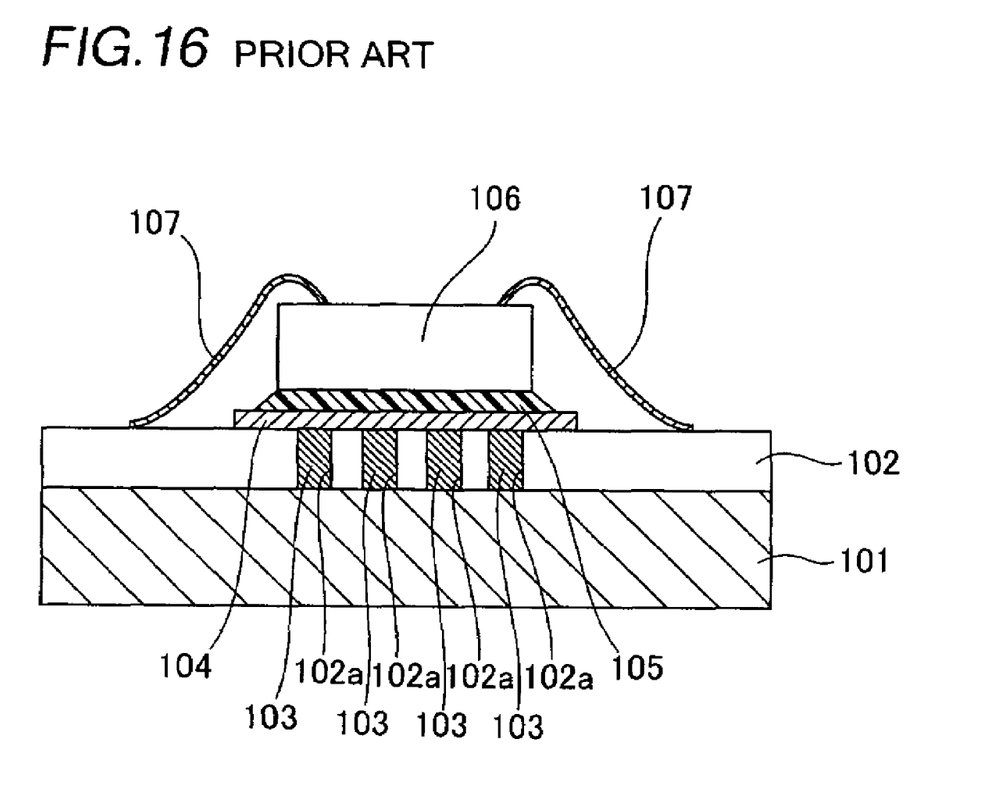
FIG. 16 is a sectional view showing the structure of a conventional circuit device.

FIG. 16 is a sectional view showing the structure of a conventional circuit device disclosed in the aforementioned Japanese Patent Laying-Open No. 7-193347. Referring to FIG. 16, a wiring structure 102 is formed on a substrate 101 in the conventional circuit device. This wiring structure 102 is formed by stacking a plurality of conductive layers constituting wires (not shown) or the like on an insulating layer. A plurality of thermal via holes 102a are formed on a prescribed region of the wiring structure 102 at prescribed intervals, to pass through the wiring structure 102 in the thickness direction. Conductors 103 formed by the aforementioned conductive layers are charged into the thermal via holes 102a, to completely fill up the thermal via holes 102a. These conductors 103 have planar upper surfaces flush with the upper surface of the wiring structure 102. A metal die pad 104 is arranged on the region of the wiring structure 102 formed with the thermal via holes 102a (conductors 103). A semiconductor element (circuit element) 106 is fixed onto the die pad 104 through an adhesive layer 105. Bonding wires 107 electrically connect the semiconductor element 106 and the wires (not shown) of the wiring structure 102 with each other. An epoxy-based sealing resin layer (not shown) is formed to cover the semiconductor element 106 and the bonding wires 107.

In the conventional circuit device shown in FIG. 16, heat generated in the semiconductor element 106 is transmitted to the wiring structure 102 through the adhesive layer 105 and the die pad 104, and further transmitted to the substrate 101 mainly through the conductors 103 filling up the thermal via holes 102a of the wiring structure 102, to be radiated.

In order to further improve heat radiability of the conventional circuit device, the thermal via holes 102a filled up with the conductors 103 of metal having high thermal conductivity must be densely arranged under the semiconductor element (circuit element) 106.

When the thermal via holes (openings) 102a filled up with the conductors 103 of metal having high thermal conductivity are densely arranged under the semiconductor element (circuit element) 106, however, the metal conductors 103 filling up the thermal via holes 102a thermally expand due to the heat generated in the semiconductor element 106 to apply stress to a portion of the wiring structure 102 around the semiconductor element 106, disadvantageously resulting in separation between the wiring structure 102 and the sealing resin layer. Thus, reliability of the circuit device is disadvantageously reduced.

If a contact hole (opening) (not shown) filled up with a metal conductor 103 connected to a prescribed wire is arranged around the semiconductor element 106, the stress applied to the wiring structure 102 as described above concentrates to this metal conductor 103 filling up the contact hole, to crack the metal constituting the conductor 103. This may result in defective connection of the wire of the circuit device, to also reduce the reliability of the circuit device.

SUMMARY OF THE INVENTION

The present invention has been proposed in order to solve the aforementioned problems, and an object of the present invention is to provide a circuit device capable of suppressing reduction of reliability resulting from heat generated in a circuit element.

In order to attain the aforementioned object, a circuit device according to an aspect of the present invention comprises a first insulating layer having a first opening and a second opening, a first conductor filling up the first opening of the first insulating layer, a second conductor, formed along the inner side surface of the second opening of the first insulating layer, having a concave upper surface and a circuit element arranged above a region of the first insulating layer formed with the first opening.

In the circuit device according to the aforementioned aspect, as hereinabove described, the circuit element is arranged above the region of the first insulating layer formed with the first opening and the first conductor fills up the first opening of the first insulating layer, whereby heat generated in the circuit element can be radiated through the first conductor filling up the first opening. Further, the circuit device is provided with the second conductor formed along the inner side surface of the second opening of the first insulating layer with the concave upper surface so that a side portion of the second conductor formed along the inner side surface of the second opening with the concave upper surface can be elastically deformed when the first conductor filling up the first opening thermally expands due to the heat generated in the circuit element, whereby the second conductor can function as a spring. Thus, stress applied to the first insulating layer close to the circuit element can be so absorbed that application of stress to the first insulating layer can be suppressed. Consequently, a sealing resin layer formed on the first insulating layer to cover the circuit element can be inhibited from separation resulting from stress applied to the first insulating layer, whereby reduction of reliability of the circuit device can be suppressed. When the first conductor filling up the first opening thermally expands due to the heat generated in the circuit element, the second conductor having the concave upper surface so functions as a spring that stress applied thereto can be absorbed, whereby the second conductor can be prevented from cracking. When the second conductor is employed as a wire, therefore, the wire can be prevented from defective connection. Reduction of the reliability of the circuit device can be suppressed also according to this structure.

The circuit device according to the aforementioned aspect preferably further comprises a filler, filling up the concave upper surface of the second conductor, having a lower Young's modulus than the second conductor. According to this structure, the filler having the lower Young's modulus than the second conductor can function as a cushioning material upon elastic deformation of the second conductor, whereby the second conductor can be inhibited from excessive deformation. Thus, the reliability of the circuit device can be further improved.

In the aforementioned circuit device comprising the filler having the lower Young's modulus than the second conductor, the filler is preferably formed by a layer mainly composed of resin. According to this structure, the Young's modulus of the filler can be easily reduced below that of the second conductor.

In the aforementioned circuit device comprising the filler formed by the layer mainly composed of resin, the layer mainly composed of resin is preferably also arranged between the first conductor filling up the first opening of the first insulating layer and the circuit element. According to this structure, the first conductor filling up the first opening of the first insulating layer and the second conductor provided in the second opening can be protected with the layer mainly composed of resin. Further, the circuit element is so arranged on the layer mainly composed of resin that adhesiveness of the circuit element with respect to the first insulating layer can be improved when the circuit element is fixed onto the layer mainly composed of resin through an adhesive layer of resin, due to excellent adhesiveness between the adhesive layer of resin and the layer mainly composed of resin. In addition, the layer mainly composed of resin arranged on the first insulating layer, filling up the concave upper surface of the second conductor formed in the second opening, bites into the concave upper surface of the second conductor. In this case, the layer mainly composed of resin acts as a nail or a wedge (anchor effect), whereby adhesiveness between the second conductor and the layer mainly composed of resin can be improved. Consequently, the reliability of the circuit device can be further improved.

In the aforementioned circuit device comprising the filler formed by the layer mainly composed of resin, a sealing resin layer is preferably so formed on the layer mainly composed of resin as to cover the circuit element. According to this structure, the sealing resin layer is formed through the layer mainly composed of resin, having the lower Young's modulus than the second conductor, whereby separation of the sealing resin layer can be more suppressed as compared with a case of directly forming the sealing resin layer on the second conductor.

In the circuit device according to the aforementioned aspect, the first conductor and the second conductor are preferably made of the same material. According to this structure, the first and second conductors can be formed through the same process, whereby the circuit device can be easily manufactured.

In the aforementioned circuit device having the first and second conductors made of the same material, the first conductor and the second conductor are preferably formed by the same layer. According to this structure, the first and second conductors can be so easily simultaneously formed that the time for manufacturing the circuit device can be reduced.

In the circuit device according to the aforementioned aspect, the first insulating layer preferably has a plurality of second openings. According to this structure, stress applied to the first insulating layer close to the circuit element can be more effectively absorbed by making second conductors having concave upper surfaces formed along the inner side surfaces of the plurality of second openings function as springs respectively, whereby application of stress to the first insulating layer can be further suppressed.

In the aforementioned circuit device comprising the first insulating layer having the plurality of second openings, the first insulating layer preferably has at least three second openings, and at least three second openings are preferably so arranged as to enclose the circuit element in plan view. According to this structure, stress applied to the first insulating layer close to the circuit element can be absorbed by making the second conductors having concave upper surfaces formed in at least three second openings function as springs while the second openings enclose the circuit element, whereby application of stress to the first insulating layer can be effectively suppressed.

In the aforementioned circuit device comprising the first insulating layer having at least three second openings, at least three second openings are preferably so provided that the whole of the circuit element is arranged in a region enclosed with the second openings connected with each other in plan view. According to this structure, application of stress to the first insulating layer can be more effectively suppressed.

In the circuit device according to the aforementioned aspect, the second opening of the first insulating layer preferably includes an opening functioning as a contact hole and another opening not functioning as a contact hole. According to this structure, the opening not functioning as a contact hole can be arranged on a position effective for absorbing stress around the circuit element or the like regardless of electric characteristics or the like, whereby application of stress to the first insulating layer can be effectively suppressed.

In the circuit device according to the aforementioned aspect, the second opening of the first insulating layer preferably has a larger opening width than the first opening. According to this structure, the second conductor can be formed along the inner side surface of the second opening to have the concave upper surface without filling up the second opening, dissimilarly to the case of forming the first conductor in the first opening of the first insulating layer.

In the circuit device according to the aforementioned aspect, the second opening of the first insulating layer preferably has an opening width larger than twice the thickness of a portion of the second conductor located on the inner side surface of the second opening. According to this structure, the second conductor can be easily inhibited from filling up the second opening of the first insulating layer, whereby the second conductor having the concave upper surface can be easily formed.

In the circuit device according to the aforementioned aspect, the lowermost portion of the concave upper surface of the second conductor is preferably formed to be lower than the upper surface of the first insulating layer. According to this structure, the second conductor can be easily elastically deformed in the first opening.

In the circuit device according to the aforementioned aspect, $H2/H1$ is preferably not more than 0.8 assuming that $H1$ represents the height of a portion between the lower surface of the first insulating layer and the upper surface of the second conductor and $H2$ represents the height of a portion between the lower surface and the upper surface of the second conductor in a substantially central portion of the second opening of the first insulating layer. According to this structure, stress applied to the first insulating layer close to the circuit element can be reduced to not more than about half as compared with a case where $H2/H1$ is equal to 1 (the second conductor completely fills up the second opening of the first insulating layer), whereby the sealing resin layer formed on the first insulating layer can be further inhibited from separation.

The circuit device according to the aforementioned aspect preferably further comprises a metal wire electrically connecting the circuit element and the second conductor with each other. According to this structure, the second conductor can be employed as a wire.

The circuit device according to the aforementioned aspect preferably further comprises a second insulating layer, arranged under the first insulating layer, having a third opening provided on a region corresponding to the first opening of the first insulating layer, a substrate arranged under the second insulating layer and a third conductor, filling up the third opening of the second insulating layer, connected to the first conductor and the substrate. According to this structure, the heat generated in the circuit element can be transmitted to the substrate through the first and third conductors provided in the first and second insulating layers respectively, whereby heat radiability of the circuit device can be improved.

In the aforementioned circuit device comprising the second insulating layer, the substrate and the third conductor, the substrate preferably includes a metal substrate. According to this structure, the heat transmitted from the circuit element to the substrate can be so efficiently radiated that the heat radiability of the circuit device can be further improved.

The aforementioned circuit device comprising the second insulating layer, the substrate and the third conductor preferably further comprises a fourth conductor, arranged between the first insulating layer and the second insulating layer, electrically connected with the second conductor. According to this structure, the fourth conductor can also be employed as a wire when the second conductor is employed as a wire.

In the aforementioned circuit device further comprising the fourth conductor connected with the second conductor, the third conductor and the fourth conductor are preferably formed by the same layer. According to this structure, the third and fourth conductors can be so simultaneously formed that the time for manufacturing the circuit device can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings.

The structure of a circuit device according to this embodiment is described with reference to FIGS. 1 and 2.

Figure 1:
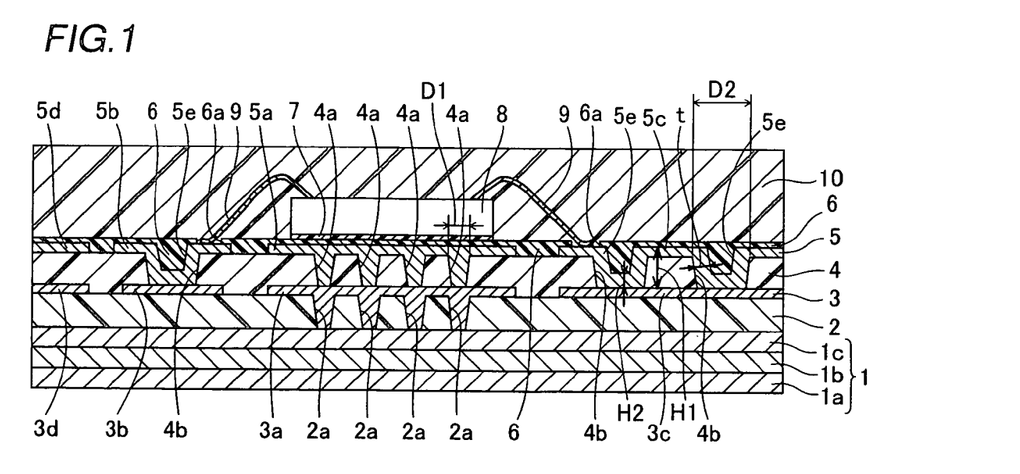
FIG. 1 is a sectional view showing the structure of a circuit device according to an embodiment of the present invention.

In the circuit device according to this embodiment, a substrate 1 having a thickness of about 100 µm to about 3 mm (about 1.5 mm, for example) is employed as shown in FIG. 1. This substrate 1 is constituted of a clad material prepared by stacking a lower metal layer 1a of copper, an intermediate metal layer 1b of an Fe—Ni alloy (the so-called invar alloy) formed on the lower metal layer 1a and an upper metal layer 1c of copper formed on the intermediate metal layer 1b. The substrate 1 is an example of the "metal substrate" in the present invention.

A first insulating layer 2, mainly composed of epoxy resin, having a thickness of about 60 µm to about 160 µm is formed on the surface of the substrate 1. This insulating layer 2 is an example of the "second insulating layer" in the present invention. A filling material having a large diameter of at least about 30 µm is added to the insulating layer 2, in order to increase thermal conductivity. This filling material is prepared from alumina ($Al_2O_3$), silica ($SiO_2$), aluminum nitride (AlN), silicon nitride (SiN) or boron nitride (BN). The weight filling factor of the filling material is about 60% to about 80%. When containing a filling material such as alumina or silica, epoxy resin exhibits thermal conductivity of about 2 W/(m·K), which is higher than the thermal conductivity (about 0.6 W/(m·K)) of epoxy resin containing no filling material.

According to this embodiment, four via holes 2a, having a diameter (via diameter) of about 100 µm, passing through the insulating layer 2 in the thickness direction are formed on a region of the insulating layer 2 located under an LSI chip (circuit element) 8 described later at prescribed intervals. The via holes 2a are examples of the "third opening" in the present invention. A first conductive layer 3 of copper, having a thickness of about 15 µm, including a thermal via portion 3a and wiring portions 3b to 3d is formed on a prescribed region of the insulating layer 2. The thermal via portion 3a of the conductive layer 3 is an example of the "third conductor" in the present invention, and the wiring portions 3b and 3c are examples of the "fourth conductor" in the present invention. The thermal via portion 3a of the conductive layer 3 is arranged under the LSI chip 8. The thermal via portion 3a, filling up the four via holes 2a, has a planar upper surface formed to extend along the upper surface of the insulating layer 2. The portions of the thermal via portion 3a filling up the four via holes 2a are in contact with the upper surface of the upper metal layer 1c of the substrate 1. This thermal via portion 3a of the conductive layer 3 has a function of transmitting heat from the LSI chip 8 to the substrate 1 and radiating the same. The insulating layer 2 exhibits thermal conductivity of about 6 W/(m·K) to about 8 W/(m·K) while the thermal via portion 3a of the conductive layer 3 fills up the via holes 2a. The wiring portions 3b to 3d of the conductive layer 3 are arranged around the LSI chip 8 and the thermal via portion 3a.

A second insulating layer 4 having a thickness and a composition substantially identical to those of the aforementioned first insulating layer 2 is formed on the conductive layer 3 to cover the conductive layer 3, while a second conductive layer 5 of copper is formed on a prescribed region of the insulating layer 4. This conductive layer 5 has a thickness of about 15 µm in a portion located on the insulating layer 4, and has another thickness t (see FIG. 1) of about 50 µm in portions located on the side surfaces of via holes 4b. The insulating layer 4 is an example of the "first insulating layer" in the present invention.

More specifically, four via holes 4a, having a diameter (opening width) D1 of about 100 µm, passing through the insulating layer 4 in the thickness direction are formed on a region of the insulating layer 4 located under the LSI chip 8, as shown in FIG. 1. These via holes 4a are examples of the "first opening" in the present invention. The four via holes 4a are formed on positions corresponding to the four via holes 2a formed in the insulating layer 2 respectively. The insulating layer 4 is also formed with the via holes 4b passing through the insulating layer 4 in regions corresponding to the wiring portions 3b and 3c of the conductive layer 3 respectively. The via holes 4b are examples of the "second opening" in the present invention. These via holes 4b have functions for serving as contact holes. The via holes 4b have a diameter (opening width) D2 of about 200 μm. In other words, the diameter (opening width) D2 of the via holes 4b is larger than twice the thickness t (about 50 μm) of the portions of the conductive layer 5 located on the inner side surfaces of the via holes 4b. As shown in FIG. 2, a large number of such via holes 4b are so arranged on peripheral regions as to enclose the whole of the LSI chip 8 in plan view. In other words, the whole of the LSI chip 8 is arranged in a region S enclosed with the large number of via holes 4b connected with each other in plan view.

The conductive layer 5 includes a filling via portion (thermal via portion) 5a, unfilling via portions 5b and 5c and a wiring portion 5d, as shown in FIG. 1. The filling via portion 5a of the conductive layer 5 is an example of the "first conductor" in the present invention, and the unfilling via portions 5b and 5c of the conductive layer 5 are examples of the "second conductor" in the present invention. The filling via portion 5a of the conductive layer 5 is arranged under the LSI chip 8. The filling via portion 5a, filling up the four via holes 4a, has a planar upper surface formed to extend along the upper surface of the insulating layer 4. Portions of the filling via portion 5a filling up the four via holes 4a are in contact with the upper surface of the thermal via portion 3a of the conductive layer 3. This filling via portion 5a of the conductive layer 5 has a function of transmitting the heat generated in the LSI chip 8 to the thermal via portion 3a of the conductive layer 3 and radiating the same. The unfilling via portions 5b and 5c are formed along the inner side surfaces of the via holes 4b, to have concave upper surfaces 5e corresponding to the via holes 4b. The lowermost portions of the upper surfaces 5e of the unfilling via portions 5b and 5c are at a level lower than the upper surface of the insulating layer 4. The unfilling via portions 5b and 5c are in contact with the surfaces of the wiring portions 3b and 3c of the conductive layer 3 respectively.

According to this embodiment, the conductive layer 5 is so formed that H2/H1 is not more than 0.8 assuming that H1 represents the height of a portion between the lower surface of the insulating layer 4 (the upper surface of the conductive layer 3) and the upper surface of the conductive layer 5 and H2 represents the height of a portion between the lower surface and the upper surface of the conductive layer 5 in substantially central portions of the via holes 4b of the insulating layer 4. Each unfilling via portion 5b is provided in correspondence to one via hole 4b, while each unfilling via portion 5c is provided in correspondence to two via holes 4b. The unfilling via portions 5b and 5c have functions for serving as wires. The wiring portion 5d of the conductive layer 5 is arranged to be connected to another LSI chip (not shown) or a chip resistor (not shown). The conductive layer 5 of Cu has a Young's modulus of about 129.8 GPa.

A protective layer 6 covers the upper surfaces of the insulating layer 4 and the conductive layer 5 with openings 6a formed in regions corresponding to wire bonding areas of the unfilling via portions 5b and 5c of the conductive layer 5. This protective layer 6 is an example of the "filler" in the present invention. The protective layer 6 has a Young's modulus of about 10 GPa, which is lower than that of the conductive layer 5. The protective layer 6 has portions filling up the concave upper surfaces 5e of the unfilling via portions 5b and 5c of the conductive layer 5. Thus, the portions of the protective layer 6 filling up the concave upper surfaces 5e of the unfilling via portions 5b and 5c of the conductive layer 5 can function as cushioning materials upon elastic deformation of the unfilling via portions 5b and 5c of the conductive layer 5, thereby inhibiting the unfilling via portions 5b and 5c from excessive deformation. The protective layer 6 also has a function of protecting the conductive layer 5. This protective layer 6 is made of thermosetting resin such as melamine derivative, liquid crystal polymer, epoxy resin, PPE (polyphenylene ether) resin, polyimide resin, fluororesin, phenolic resin or polyamide bismaleimide. Liquid crystal polymer, epoxy resin or melamine derivative having excellent high-frequency characteristics is preferable as the material for the protective layer 6. Further, a filling material such as SiO$_2$ may be added to the protective layer 6.

The LSI chip 8 is fixed onto a region of the protective layer 6 located on the thermal via portion 5a of the conductive layer 5 through an adhesive layer 7 of epoxy resin having a thickness of about 20 μm. The LSI chip 8 is an example of the "circuit element" in the present invention. The thermal expansion coefficient of the LSI chip 8 having a single-crystalline silicon substrate (not shown) is about 4 ppm/° C. This LSI chip 8 is electrically connected to the unfilling via portions 5b and 5c of the conductive layer 5 through wires 9 of metal. The wires 9 are examples of the "metal wire" in the present invention.

A sealing resin layer 10 of epoxy resin or the like is formed to cover the LSI chip 8 and the protective layer 6, in order to protect the LSI chip 8 fixed to the circuit device etc. The sealing resin layer 10 is an example of the "sealing resin layer" in the present invention.

According to this embodiment, as hereinabove described, the LSI chip 8 is arranged above the region of the insulating layer 4 formed with the via holes 4a while the via holes 4a of the insulating layer 4 are filled up with the filling via portion 5a, whereby the heat generated in the LSI chip 8 can be radiated through the filling via portion 5a filling up the via holes 4a. Further, the unfilling via portions 5b and 5c formed along the inner side surfaces of the via holes 4b of the insulating layer 4 with the concave upper surfaces 5e corresponding to the via holes 4b are so provided that side portions of the unfilling via portions 5b and 5c formed along the inner side surfaces of the via holes 4b with the concave upper surfaces 5e can be elastically deformed when the portions of the filling via portion 5a filling up the four via holes 4a thermally expand due to the heat generated in the LSI chip 8, whereby the unfilling via portions 5b and 5c can function as springs. Thus, stress applied to the insulating layer 4 close to the LSI chip 8 can be so absorbed that application of stress to the insulating layer 4 can be suppressed. Consequently, the sealing resin layer 10 formed on the insulating layer 4 to cover the LSI chip 8 can be inhibited from separation resulting from stress applied to the insulating layer 4, whereby reduction of reliability of the circuit device can be suppressed. When the portions of the filling via portion 5a filling up the via holes 4a thermally expand due to the heat generated in the LSI chip 8, further, the unfilling via portions 5b and 5c having the concave upper surfaces 5e can function as springs absorbing stress applied thereto, whereby the unfilling via portions 5b and 5c can be inhibited from cracking. When the unfilling via portions 5b and 5c are employed as wires, therefore, the wires can be inhibited from defective connection. Reduction of the reliability of the circuit device can be suppressed also according to this structure.

According to this embodiment, the protective layer 6, filling up the concave upper surfaces 5e of the unfilling via portions 5b and 5c with the lower Young's modulus than the unfilling via portions 5b and 5c, is so provided as to function as a cushioning material upon elastic deformation of the unfilling via portions 5*b* and 5*c*, whereby the unfilling via portions 5*b* and 5*c* can be inhibited from excessive deformation. Thus, the reliability of the circuit device can be further improved.

According to this embodiment, the LSI chip 8 is so arranged on the protective layer 6 that adhesiveness of the LSI chip 8 with respect to the substrate 1 can be improved when the LSI chip 8 is fixed onto the substrate 1 through the adhesive layer 7 of resin, due to excellent adhesiveness between the adhesive layer 7 of resin and the protective layer 6. Further, the protective layer 6 arranged on the insulating layer 4, filling up the concave upper surfaces 5*e* of the unfilling via portions 5*b* and 5*c* formed in the via holes 4*b*, bites into the concave upper surfaces 5*e* of the unfilling via portions 5*b* and 5*c*. In this case, the protective layer 6 acts as a nail or a wedge (anchor effect), whereby adhesiveness between the unfilling via portions 5*b* and 5*c* and the protective layer 6 can be improved. Consequently, the reliability of the circuit device can be further improved.

According to this embodiment, the via holes 4*b* of the insulating layer 4 are so provided that the whole of the LSI chip 8 is arranged in the region S enclosed with the via holes 4*b* connected with each other in plan view so that stress applied to the insulating layer 4 close to the LSI chip 8 can be absorbed through the concave upper surfaces 5*e*, serving as springs, of the unfilling via portions 5*b* and 5*c* formed in the via holes 4*b* enclosing the whole of the LSI chip 8, whereby application of stress to the insulating layer 4 can be effectively suppressed.

A process of manufacturing the circuit device according to this embodiment is now described with reference to FIGS. 1 to 13.

Figure 3:
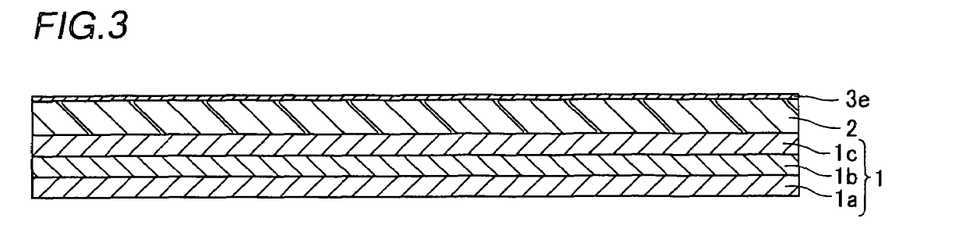
FIGS. 3 to 13 are sectional views for illustrating a process of manufacturing the circuit device according to the embodiment of the present invention.

First, the substrate 1 including the lower and upper metal layers 1*a* and 1*c* of copper and the intermediate metal layer 1*b* of an invar alloy is formed as shown in FIG. 3. More specifically, the intermediate metal layer 1*b* is arranged between the lower and upper metal layers 1*a* and 1*b* and these layers 1*a* to 1*c* are press-bonded to each other, thereby forming the substrate 1 of the three-layer clad material. At this time, the thickness of the substrate 1 is set to about 100 μm to about 3 mm (about 1.5 mm, for example).

Then, epoxy resin containing a filling material such as alumina or silica is applied onto the surface of the substrate 1, thereby forming the insulating layer 2 having the thickness of about 60 μm to about 160 μm. Thereafter copper foil 3*e* having a thickness of about 3 μm is press-bonded onto the insulating layer 2.

Figure 4:
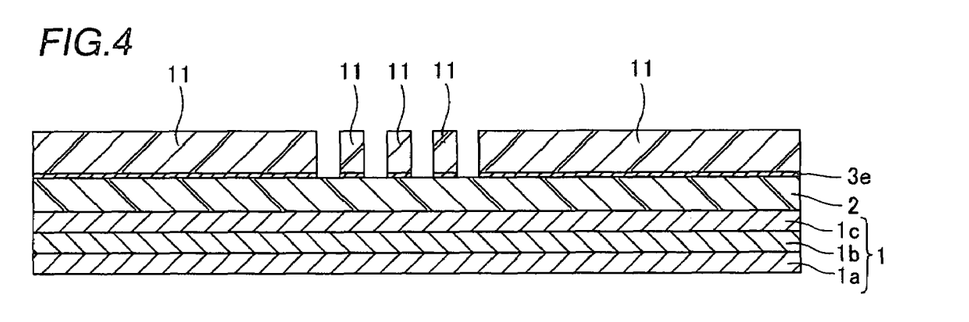

As shown in FIG. 4, resist films 11 are formed on prescribed regions of the copper foil 3*e* by photolithography. The resist films 11 are employed as masks for removing portions of the copper foil 3*e* located on regions for forming the via holes 2*a* (see FIG. 1). Thus, the regions of the insulating layer 2 for forming the via holes 2*a* are exposed. Thereafter the resist films 11 are removed.

Figure 5:
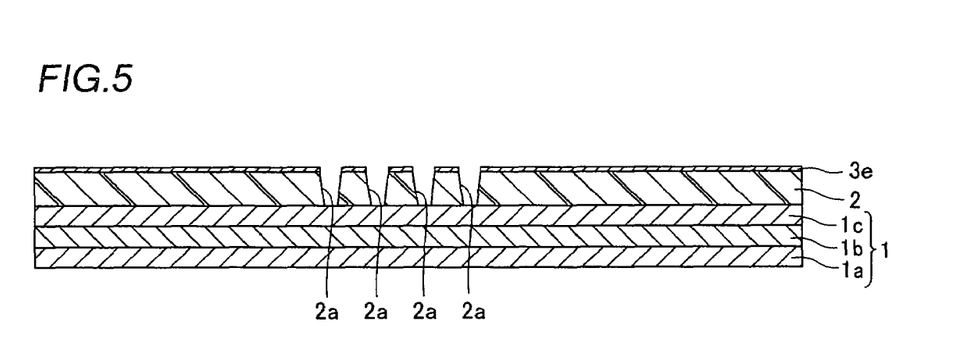

As shown in FIG. 5, the remaining copper foil portions 3*e* are employed as masks for applying a carbon dioxide laser beam or a UV laser beam from above the same, thereby removing regions of the insulating layer 2 located between the exposed surface portions and the surface of the substrate 1. Thus, the four via holes 2*a* having the diameter of about 100 μm are formed in the insulating layer 2, to pass through the insulating layer 2 in the thickness direction.

Figure 6:
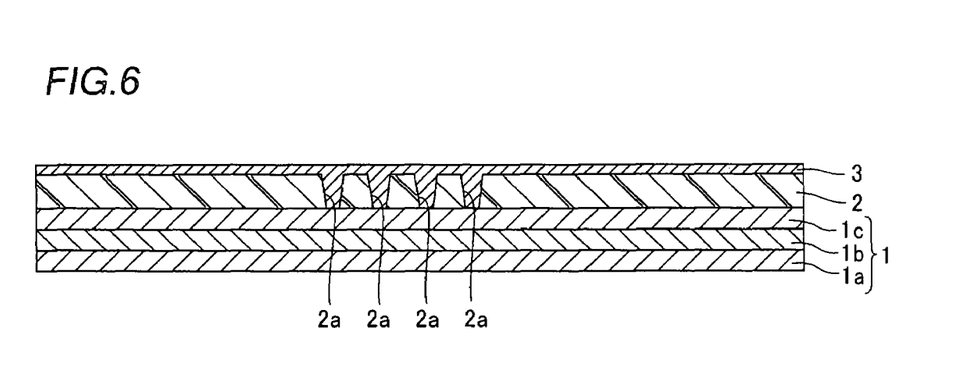

As shown in FIG. 6, the upper surfaces of the remaining copper foil portions 3*e* (see FIG. 5) and the inner surfaces of the via holes 2*a* are plated with copper in a thickness of about 0.5 μm by electroless plating. Then, the upper surfaces of the remaining copper foil portions 3*e* and the inner portions of the via holes 2*a* are plated with copper by electrolytic plating. According to this embodiment, an inhibitor and an accelerator are added to a plating solution employed for the electroless plating, so that the inhibitor and the accelerator adsorbed onto the upper surfaces of the remaining copper foil portions 3*e* and the inner surfaces of the via holes 2*a* respectively. Thus, the thickness of copper plating films formed on the inner side surfaces of the via holes 2*a* can be increased to about 50 μm while suppressing the thickness of that formed on the insulating layer 2, whereby the via holes 2*a* having the diameter (opening width) D1 of about 100 μm can be filled up with copper. Consequently, the conductive layer 3 having the thickness of about 15 μm is formed on the insulating layer 2 with the planar upper surface while filling up the via holes 2*a*, as shown in FIG. 6.

Figure 7:
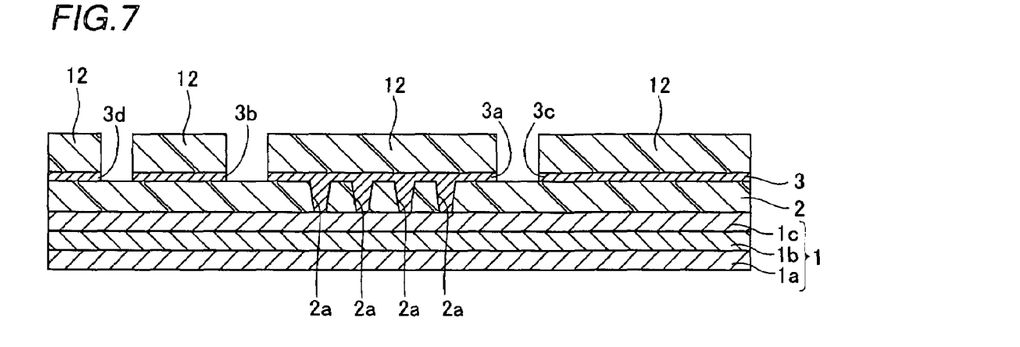

As shown in FIG. 7, resist films 12 are formed on prescribed regions of the conductive layer 3 by photolithography. The resist films 12 are employed as masks for patterning the conductive layer 3 by etching, thereby forming the thermal via portion 3*a* located under the LSI chip 8 (see FIG. 1) and the wiring portions 3*b* to 3*d*. Thereafter the resist films 12 are removed.

Figure 8:
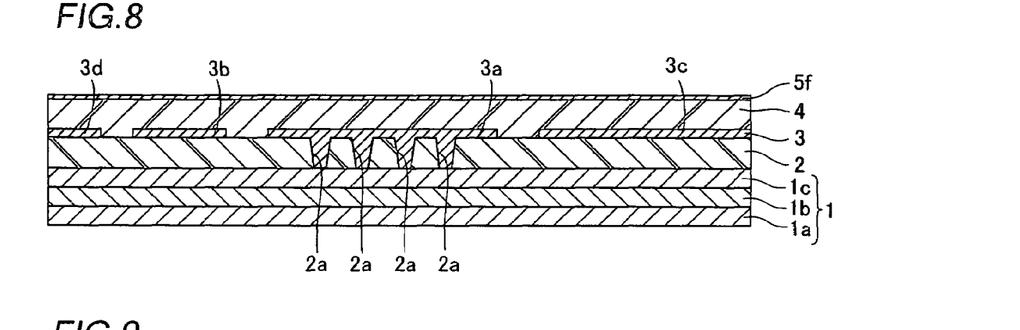

As shown in FIG. 8, epoxy resin containing a filling material such as alumina or silica is applied to cover the conductive layer 3, thereby forming the insulating layer 4 having the thickness of about 60 μm to about 160 μm. Thereafter copper foil 5*f* having a thickness of about 3 μm is press-bonded onto the insulating layer 4.

Figure 9:
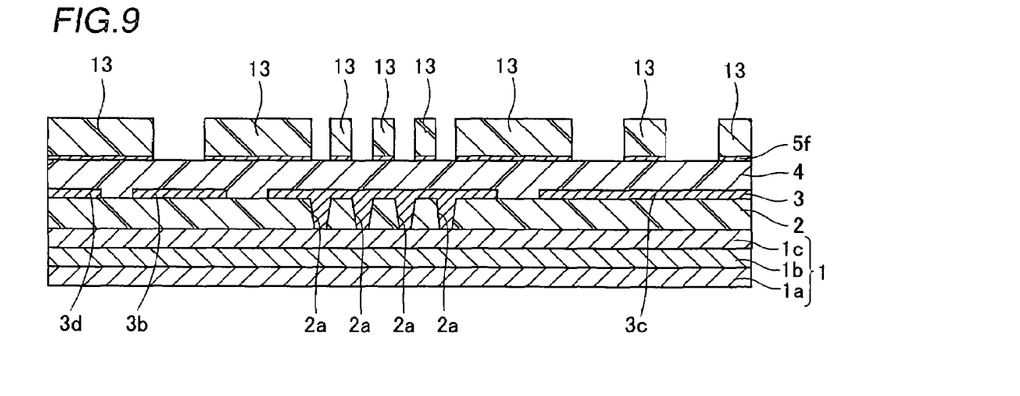

As shown in FIG. 9, resist films 13 are formed on prescribed regions of the copper foil 5*f* by photolithography. The resist films 13 are employed as masks for removing portions of the copper foil 5*f* located on regions for forming the via holes 4*a* and 4*b* (see FIG. 1) by etching. Thus, the regions of the insulating layer 4 for forming the via holes 4*a* and 4*b* are exposed. Thereafter the resist films 13 are removed.

Figure 10:
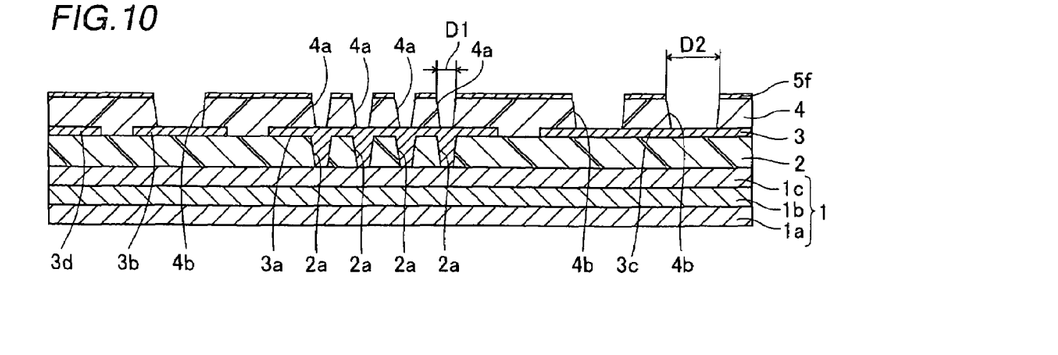

As shown in FIG. 10, the remaining copper foil portions 5*f* are employed as masks for applying a carbon dioxide gas laser beam or a UV laser beam from above the same, thereby removing regions of the insulating layer 4 located between the exposed surface portions and the surface of the conductive layer 3. Thus, the four via holes 4*a* having the diameter (opening width) D1 of about 100 μm and the via holes 4*b* having the diameter (opening width) D2 of about 200 μm are simultaneously formed in the insulating layer 4, to pass through the insulating layer 4 in the thickness direction.

Figure 2:
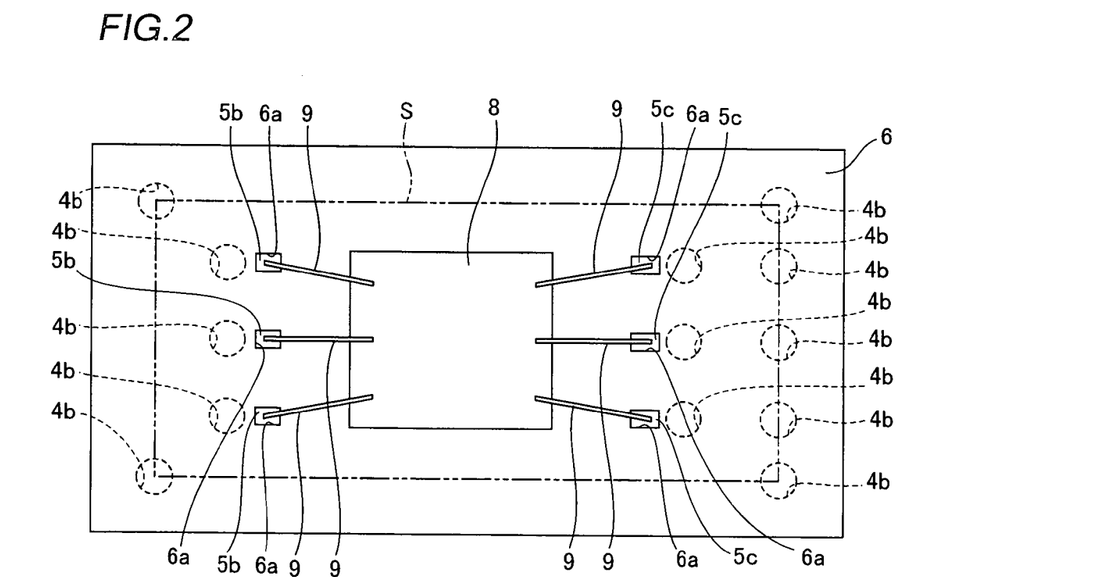
FIG. 2 is a plan view showing the structure of the circuit device according to the embodiment shown in FIG. 1.

The via holes 4*b* are provided on at least three portions to enclose the LSI chip 8, and so laid out that the whole of the LSI chip 8 is arranged in the region S enclosed with at least three via holes 4*b* connected with each other in plan view, as shown in FIG. 2. According to this embodiment, all via holes excluding those in the region provided with the circuit element such as the LSI chip 8 are formed as unfilled via holes similarly to the via holes 4*b*.

Figure 11:
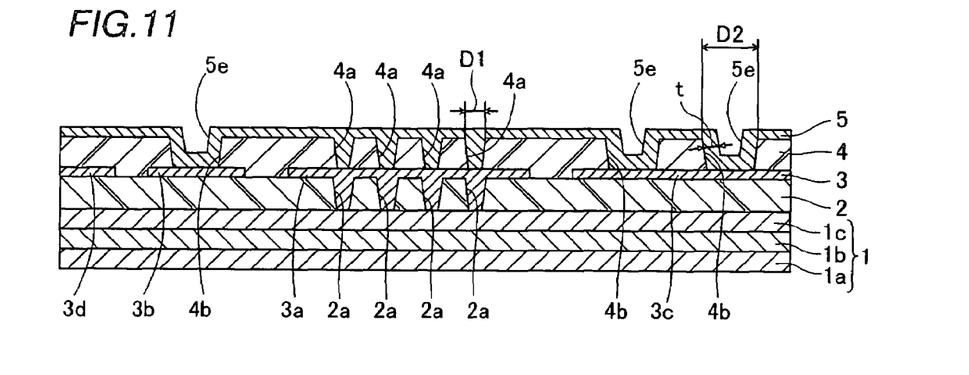

As shown in FIG. 11, the upper surfaces of the remaining copper foil portions 5*f* (see FIG. 10) and the inner surfaces of the via holes 4*a* and 4*b* are plated with copper in a thickness of about 0.5 μm by electroless plating. Then, the upper surfaces of the remaining copper foil portions 5*f* and the inner portions of the via holes 4*a* and 4*b* are plated with copper by electrolytic plating. In the electroless plating, an inhibitor and an accelerator are added to a plating solution, so that the inhibitor and the accelerator are adsorbed onto the upper surfaces of the remaining copper foil portions 3*e* and the inner surfaces of the via holes 4*a* respectively. Thus, the thickness of copper plating films formed on the inner side surfaces of the via holes 4*a* can be so increased that the via holes 4*a* can be filled up with copper. Consequently, the conductive layer 5 having the thickness of about 15 μm is formed on the insulating layer 4 while filling up the via holes 4a. On the other hand, the diameter D2 (about 200 μm) of the via holes 4b is larger than the thickness t (about 50 μm) of the portions of the conductive layer 5 located on the inner side surfaces of the via holes 4b, whereby the conductive layer 5 is formed along the inner side surfaces of the via holes 4b to have the concave upper surfaces 5e corresponding to the via holes 4b.

Figure 12:
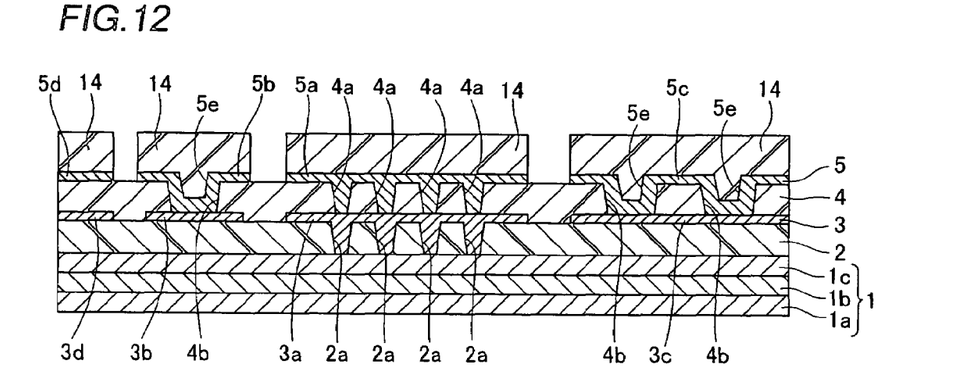

As shown in FIG. 12, resist films 14 are formed on prescribed regions of the conductive layer 5 by photolithography. The resist films 14 are employed as masks for patterning the conductive layer 5 by etching, thereby forming the filling via portion (thermal via portion) 5a located under the LSI chip 8 (see FIG. 1) and the unfilling via portions 5b and 5c and the wiring portion 5d located around the LSI chip 8. Thereafter the resist films 14 are removed.

Figure 13:
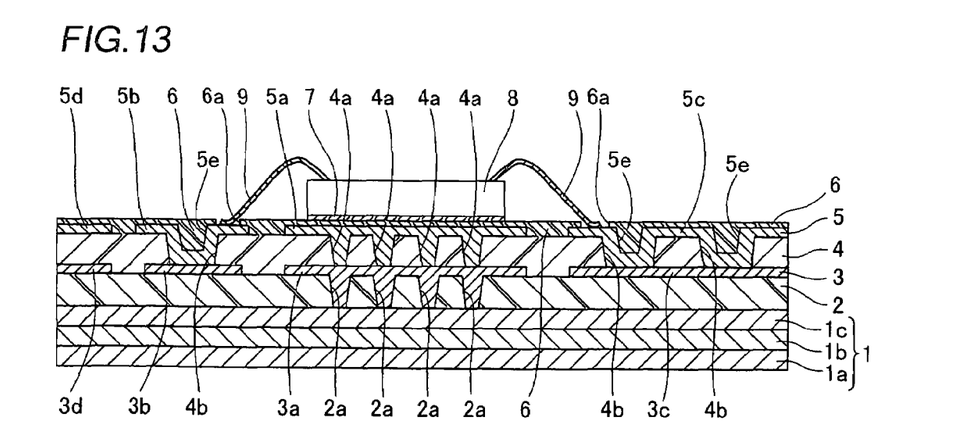

As shown in FIG. 13, the protective layer 6 having the openings 6a in the regions corresponding to the wire bonding areas of the unfilling via portions 5b and 5c of the conductive layer 5 is formed to cover the insulating layer 4 and the conductive layer 5. At this time, the protective layer 6 fills up the concave upper surfaces 5e of the unfilling via portions 5b and 5c, while the upper surface of the protective layer 6 is planarized.

Then, the LSI chip 8 is fixed onto the portion of the protective layer 6 located on the filling via portion 5a of the conductive layer 5 through the adhesive layer 7 of epoxy resin having the thickness of about 50 μm. The thickness of the adhesive layer 7 is about 20 μm after this fixation of the LSI chip 8. Thereafter the LSI chip 8 and the wire bonding areas of the unfilling via portions 5b and 5c of the conductive layer 5 are electrically connected with each other through the wires 9 of metal.

Finally, the sealing resin layer 10 of epoxy resin is formed to cover the LSI chip 8 and the protective layer 6 in order to protect the LSI chip 8 provided on the substrate 1 as shown in FIG. 1, thereby forming the circuit device according to this embodiment.

An experiment conducted for confirming the effects of the circuit device according to the embodiment of the present invention is now described. In this experiment, models according to Examples 1 to 10 corresponding to this embodiment and comparative example 1 were prepared through thermal simulation software, and these models were analyzed.

In the models according to Examples 1 to 10, conductive layers 5 were so formed that H2/H1 were 0, 0.1, 0.2, 0.3, 0.4, 0.5, 0.6, 0.7, 0.8 and 0.9 respectively assuming that H1 represents the heights of portions between the lower surfaces of insulating layers 4 (upper surfaces of conductive layers 3) and the upper surfaces of the conductive layers 5 and H2 represents the heights of portions between the lower surfaces and the upper surfaces of the conductive layers 5 in substantially central portions of via holes 4b of the insulating layers 4. A conductive layer of the model according to comparative example 1 was so formed that H2/H1 was 1. In other words, the conductive layer fills up via holes 4b of an insulating layer 4 in the model according to comparative example 1. The remaining structures of the models according to Examples 1 to 10 and comparative example 1 are similar to those of the aforementioned embodiment.

Figure 14:
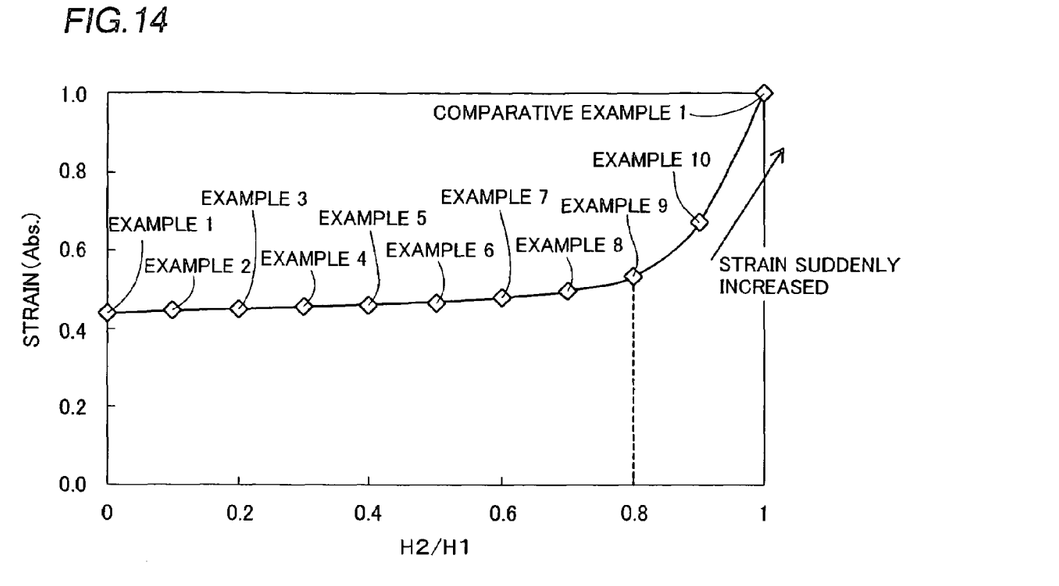
FIG. 14 is a diagram for illustrating an experiment conducted for confirming effects of the circuit device according to the embodiment of the present invention.

Strains of the insulating layers around LSI chips 8 under a high temperature were measured as to these models. FIG. 14 shows the results. The strains of the insulating layers around the LSI chips 8 under a high temperature were standardized with reference to the strain of the insulating layer around the LSI chip 8 under a high temperature in the model according to comparative example 1 having the conductive layer so formed that H2/H1 was 1.

Referring to FIG. 14, it has been proved that the strains of the insulating layers around the LSI chips 8 under a high temperature are smaller in the models according to Examples 1 to 10 having H2/H1 of 0 to 0.9 as compared with the model according to comparative example 1 having H2/H1 of 1. This is conceivably for the following reason: The models according to Examples 1 to 10 having H2/H1 of 0 to 0.9 can conceivably suppress application of stress to the insulating layers since concave upper surfaces 5e of unfilling via portions 5b and 5c serving as springs can absorb stress applied to the insulating layers around the LSI chips 8 when via holes 4a and filling via portions 5a thermally expand due to heat generated in the LSI chips 8. It has also been proved that the strains of the insulating layers around the LSI chips 8 of the models according to Examples 1 to 9 having H2/H1 of 0 to 0.8 under a high temperature are not more than about half that of the model according to comparative example 1, and remarkably smaller than that of the model according to Example 10 having H2/H1 of 0.9. This is conceivably for the following reason: In the models according to Examples 1 to 9 having H2/H1 of 0 to 0.8, the depths of the upper surfaces 5e of the unfilling via portions 5b and 5c can be so increased that the upper surfaces 5e can easily serve as springs.

Although the present invention has been described and illustrated in detail, it is clearly understood that the same is by way of illustration and example only and is not to be taken by way of limitation, the spirit and scope of the present invention being limited only by the terms of the appended claims.

For example, while the aforementioned embodiment of the present invention is applied to the circuit device having the built-in LSI chip, the present invention is not restricted to this but is also applicable to a circuit device having a built-in circuit element other than the LSI chip.

While the protective layer 6 of resin is employed also as a filler filling up the concave upper surfaces 5e of the conductive layer 5 in addition to the function serving as the protective film for the conductive layer 5 in the aforementioned embodiment, the present invention is not restricted to this but a filler having a lower Young's modulus than the conductive layer 5 may alternatively be employed for filling up the concave upper surfaces 5e of the conductive layer 5, for thereafter forming the protective layer 6 as the protective film for the conductive layer 5. In this case, the filler can be prepared from aluminum whose Young's modulus is about 70.3 GPa, for example.

While the aforementioned embodiment of the present invention is applied to the two-layer circuit device having the second insulating layer 4 and the second conductive layer 5 successively formed on the first conductive layer 3, the present invention is not restricted to this but is also applicable to a single-layer circuit device. The present invention is also applicable to a circuit device having a third insulating layer and a third conductive layer successively formed on a second conductive layer. The present invention is further applicable to a multilayer circuit device having at least four layers.

Figure 15:
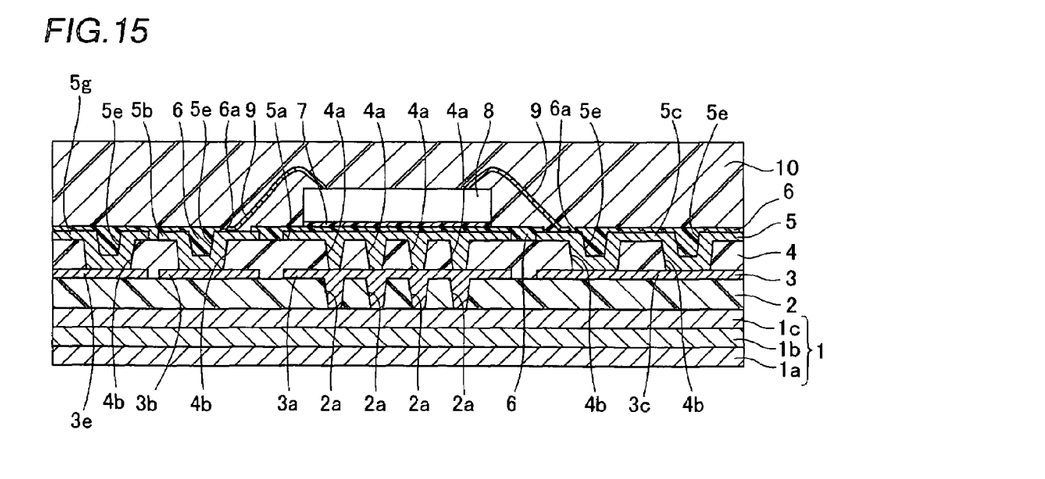
FIG. 15 is a sectional view showing the structure of a circuit device according to a modification of the embodiment of the present invention.

While all via holes 4b are provided with the unfilling via portions 5b and 5c serving as wires for functioning as contact holes in the aforementioned embodiment, the present invention is not restricted to this but via holes 4b serving as contact holes and a via hole 4b not serving as a contact hole may alternatively be provided as in a modification of the aforementioned embodiment shown in FIG. 15. More specifically, a via hole 5b provided with an unfilling via potion 5g not serving as a wire may be formed on a non-wiring portion 3e.

In this case, the via hole 4b not serving as a contact hole can be arranged on a position around an LSI chip or the like effective for absorption of stress, whereby application of stress to an insulating layer 4 can be effectively suppressed.

What is claimed is:

1. A circuit device comprising:
    a first insulating layer having a first opening and a second opening;
    a first conductor filling up said first opening of said first insulating layer;
    a second conductor, formed along the inner side surface of said second opening of said first insulating layer, having a concave upper surface;
    a circuit element arranged above a region of said first insulating layer formed with said first opening;
    a filler formed over the concave upper surface of the second conductor and having an opening;
    a metal wire electrically connecting said circuit element with said second conductor, wherein said concave upper surface of said second conductor absorbs stress applied thereto such that defective connection of said metal wire is inhibited and wherein the metal wire is connected to the second conductor via the opening of the filler outside the circuit element;
    a second insulating layer, arranged under said first insulating layer, having a third opening provided on a region corresponding to said first opening of said first insulating layer;
    a substrate arranged under said second insulating layer; and
    a third conductor, filling up said third opening of said second insulating layer, connected to said first conductor and said substrate; and
    a fourth conductor, arranged between said first insulating layer and said second insulating layer, electrically connected with said second conductor,
    wherein said third conductor and said fourth conductor are formed by the same layer.

2. A circuit device comprising:
    a first insulating layer having a first opening and a second opening;
    a first conductor filling up said first opening of said first insulating layer;
    a second conductor, formed along the inner side surface of said second opening of said first insulating layer, having a concave upper surface;
    a circuit element arranged above a region of said first insulating layer formed with said first opening;
    a metal wire electrically connecting said circuit element with said second conductor, wherein said concave upper surface of said second conductor absorbs stress applied thereto such that defective connection of said metal wire is inhibited;
    a second insulating layer, arranged under said first insulating layer, having a third opening provided on a region corresponding to said first opening of said first insulating layer;
    a substrate arranged under said second insulating layer;
    and a third conductor, filling up said third opening of said second insulating layer, connected to said first conductor and said substrate; and
    a fourth conductor, arranged between said first insulating layer and said second insulating layer, electrically connected with said second conductor,
    wherein said third conductor and said fourth conductor are formed by the same layer.

\* \* \* \* \*